United States Patent
Kim et al.

(10) Patent No.: US 10,466,313 B2
(45) Date of Patent: Nov. 5, 2019

(54) MAGNETIC FIELD SENSOR AND APPARATUS FOR MEASURING MAGNETIC FIELD

(71) Applicant: KOREA RESEARCH INSTITUTE OF STANDARDS AND SCIENCE, Daejeon (KR)

(72) Inventors: Wan-Seop Kim, Daejeon (KR); Po Gyu Park, Daejeon (KR); Young Gyun Kim, Daejeon (KR); Mun Seog Kim, Daejeon (KR); Dan Bee Kim, Daejeon (KR); Sung Jung Joo, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 229 days.

(21) Appl. No.: 15/534,861

(22) PCT Filed: Nov. 18, 2015

(86) PCT No.: PCT/KR2015/012421
§ 371 (c)(1),
(2) Date: Jun. 9, 2017

(87) PCT Pub. No.: WO2016/093507
PCT Pub. Date: Jun. 16, 2016

(65) Prior Publication Data
US 2017/0371003 A1    Dec. 28, 2017

(30) Foreign Application Priority Data
Dec. 12, 2014 (KR) .................. 10-2014-0179225

(51) Int. Cl.
*G01R 33/02* (2006.01)
*G01R 33/06* (2006.01)
(Continued)

(52) U.S. Cl.
CPC ....... *G01R 33/066* (2013.01); *G01R 27/2605* (2013.01); *G01R 29/08* (2013.01); *G01R 33/0206* (2013.01); *H01L 43/08* (2013.01)

(58) Field of Classification Search
CPC ........ G01R 33/02; G01R 33/06; G01R 27/08; G01R 27/26; H01L 43/08; G01N 27/00; G01N 27/22
See application file for complete search history.

(56) References Cited

U.S. PATENT DOCUMENTS 5,130,639 A * 7/1992 Hachey ................ G01N 33/205
324/71.4
5,709,225 A   1/1998 Budgifvars et al.
(Continued)

FOREIGN PATENT DOCUMENTS

EP    0702981 A1    3/1996
JP    H06-294690 A  10/1994
(Continued)

OTHER PUBLICATIONS

International Search Report PCT/ISA/210 for International Application No. PCT/KR2015/012421 dated Mar. 28, 2016.

*Primary Examiner* — Neel D Shah
(74) *Attorney, Agent, or Firm* — Harness, Dickey & Pierce, P.L.C.

(57) ABSTRACT

A magnetic field sensor of the present invention includes a first electrode including a magnetic material, a second electrode including a non-magnetic material, a common electrode disposed between the first electrode and the second electrode and connected to a ground terminal, a power supplier of which one end is connected to the first electrode and the second electrode and of which another end is connected to the common electrode to supply power of a frequency band required, a variable resistor configured to control at least one of a resistance value between the first
(Continued)

electrode and the power supplier or a resistance value between the second electrode and the power supplier, and a differential amplifier connected to the first electrode through a positive terminal and connected to the second electrode through a negative terminal to output a difference value between a first capacitance generated by the first electrode and a second capacitance generated by the second electrode in response to external application of a magnetic field.

15 Claims, 6 Drawing Sheets

(51) Int. Cl.

| | | |
|---|---|---|
| G01R 27/08 | (2006.01) | |
| G01R 27/26 | (2006.01) | |
| H01L 43/08 | (2006.01) | |
| G01N 27/00 | (2006.01) | |
| G01N 27/22 | (2006.01) | |
| G01R 29/08 | (2006.01) | |

(56) References Cited

U.S. PATENT DOCUMENTS

| | | |
|---|---|---|
| 5,719,336 A | 2/1998 | Ando et al. |
| 5,818,227 A | 10/1998 | Payne et al. |
| 5,834,928 A * | 11/1998 | Doutre ............... G01N 33/205 324/71.4 |
| 6,462,566 B1 | 10/2002 | Schoefthaler et al. |
| 6,765,394 B1 | 7/2004 | Igel et al. |
| 7,028,548 B2 | 4/2006 | Higuchi et al. |
| 2004/0021463 A1 | 2/2004 | Miyazawa et al. |
| 2004/0187577 A1 | 9/2004 | Higuchi et al. |
| 2005/0231185 A1 * | 10/2005 | Marcotte ............... G01N 15/02 324/71.1 |
| 2010/0144300 A1 | 6/2010 | Someya |
| 2010/0295546 A1 | 11/2010 | Walther et al. |
| 2011/0163768 A1 | 7/2011 | Kwon et al. |
| 2011/0192229 A1 | 8/2011 | Chen et al. |
| 2013/0342218 A1 | 12/2013 | Hahl et al. |

FOREIGN PATENT DOCUMENTS

| | | |
|---|---|---|
| JP | H08313551 A | 11/1996 |
| JP | 2002-100976 A | 4/2002 |
| JP | 2002-533683 A | 10/2002 |
| JP | 2004-317484 A | 11/2004 |
| JP | 4052671 B2 | 2/2008 |
| JP | 2010-210622 A | 9/2010 |
| KR | 1999-0064680 A | 8/1999 |
| KR | 2007-0017142 A | 2/2007 |
| KR | 10-0968896 B1 | 7/2010 |
| KR | 2011-0080253 A | 7/2011 |
| KR | 10-1207995 B1 | 12/2012 |
| WO | WO-97/31274 A1 | 8/1997 |
| WO | WO-2005/085761 A1 | 9/2005 |

* cited by examiner

MAGNETIC FIELD SENSOR AND APPARATUS FOR MEASURING MAGNETIC FIELD

CROSS-REFERENCE TO RELATED APPLICATIONS

This application is a national phase under 35 U.S.C. § 371 of PCT International Application No. PCT/KR2015/012421 which has an International filing date of Nov. 18, 2015, which claims priority to Korean Application No. 10-2014-0179225, filed Dec. 12, 2014, the entire contents of each of which are hereby incorporated by reference.

FIELD

Technical Field

The present invention disclosed herein relates to a magnetic field measurement system, and more particularly, to a magnetic field sensor and a magnetic field measurement device capable of measuring a DC magnetic field and an AC magnetic field of a wide frequency domain.

Background Art

Magnetic fields may be classified into DC magnetic fields and AC magnetic fields. Most magnetic field sensors may measure magnetic fields from DC magnetic fields to AC magnetic fields of several hundred hertz (Hz). However, it is difficult to measure DC magnetic fields using magnetic field sensors for measuring AC magnetic fields. Furthermore, different types of magnetic field sensors should be used according to frequency bands in order to measure AC magnetic fields of from dozens of kilohertz (kHz) to several megahertz (MHz).

As described above, various types of equipment and sensors should be used to measure magnetic fields, i.e., DC and AC magnetic fields, and a larger number of pieces of equipment and sensors are required for measuring magnetic fields within a wide frequency band.

DISCLOSURE OF THE INVENTION

Technical Problem

The present invention provides a magnetic field sensor and a magnetic field measurement device capable of measuring both DC and AC magnetic fields within a wide frequency band.

The present invention also provides a magnetic field sensor and a magnetic field measurement device capable of measuring magnetic fields while reducing an environmental influence such as temperature.

Technical Solution

An embodiment of the present invention provides a magnetic field sensor including: a first electrode including a magnetic material at least partially; a second electrode including a non-magnetic material at least partially; a common electrode disposed between the first electrode and the second electrode and connected to a ground terminal; a power supplier of which one end is connected to the first electrode and the second electrode and of which another end is connected to the common electrode to supply power of a frequency band required; a variable resistor configured to control at least one of a resistance value between the first electrode and the power supplier or a resistance value between the second electrode and the power supplier; and a differential amplifier connected to the first electrode through a positive terminal and connected to the second electrode through a negative terminal to output a difference value between a first capacitance generated by the first electrode and a second capacitance generated by the second electrode in response to external application of a magnetic field.

In an embodiment, the first electrode and the common electrode may form a single electric capacitive sensor, and the second electrode and the common electrode may form another single electric capacitive sensor.

In an embodiment, the variable resistor may include at least one of: a first variable resistor element disposed between the first electrode and the power supplier to control a resistance value; or a second variable resistor element disposed between the second electrode and the power supplier to control a resistance value.

In an embodiment, the first variable resistor element and the second variable resistor element may output a resistance change value which adjusts the difference value to zero or a minimized value in response to a resistor control signal.

In an embodiment, the first electrode, the second electrode, and the common electrode may be arranged within a Zero-Gauss chamber to measure a null balance for magnetic field measurement, and the difference value may be output in response to an applied magnetic field on a basis of a magnetic field change depending on the null balance, wherein the null balance may be a state in which the difference value obtained from the first electrode, the second electrode, and the common electrode is set to be zero or a minimized value.

In an embodiment, the magnetic field may be applied in a perpendicular direction to surfaces of the first electrode and the second electrode.

In an embodiment of the present invention, a magnetic field measurement device includes: at least one magnetic field sensor configured to measure a capacitance depending on a change of a magnetic field; and a signal processor configured to receive the capacitance and measure the magnetic field, wherein each of the at least one magnetic field sensor includes: a first electrode including a magnetic material at least partially; a second electrode including a non-magnetic material at least partially; a common electrode disposed between the first electrode and the second electrode and connected to a ground terminal; a power supplier of which one end is connected to the first electrode and the second electrode and of which another end is connected to the common electrode to supply power of a frequency band required; a variable resistor configured to control at least one of a resistance value between the first electrode and the power supplier or a resistance value between the second electrode and the power supplier; and a differential amplifier connected to the first electrode through a positive terminal and connected to the second electrode through a negative terminal to output a difference value between a first capacitance generated by the first electrode and a second capacitance generated by the second electrode in response to external application of a magnetic field.

In an embodiment, the signal processor may include: a gain compensator configured to receive the difference value and compensate a gain of the difference value received; a memory configured to store a magnetic field measurement table containing a magnetic field intensity corresponding to the difference value; a controller configured to obtain, on a basis of the magnetic field measurement table, the magnetic field intensity corresponding to the gain-compensated difference value and output the magnetic field intensity obtained; and a display unit configured to display the magnetic field intensity output.

In an embodiment, upon outputting a resistor control signal for controlling a resistance value of the variable resistor so that the difference value becomes zero or minimized, the controller may measure the magnetic field on a basis of one of the resistor control signal and the resistance value controlled in response to the resistor control signal.

In an embodiment, the first electrode and the common electrode may form a single electric capacitive sensor, and the second electrode and the common electrode may form another single electric capacitive sensor.

In an embodiment, the variable resistor may include at least one of: a first variable resistor element disposed between the first electrode and the power supplier to control a resistance value; or a second variable resistor element disposed between the second electrode and the power supplier to control a resistance value.

In an embodiment, the first variable resistor element and the second variable resistor element may output a resistance change value which adjusts the difference value to zero or a minimized value in order to measure the magnetic field in response to a resistor control signal.

In an embodiment, the first electrode, the second electrode, and the common electrode may be arranged within a Zero-Gauss chamber to measure a null balance for magnetic field measurement, and the difference value may be output in response to an applied magnetic field on a basis of a magnetic field change depending on the null balance, wherein the null balance may be a state in which the difference value obtained from the first electrode, the second electrode, and the common electrode is set to be zero or a minimized value.

In an embodiment, the magnetic field may be applied in a perpendicular direction to surfaces of the first electrode and the second electrode.

In an embodiment of the present invention, a magnetic field sensor includes: a first electrode including a magnetic material at least partially; a second electrode including a non-magnetic material at least partially; a common electrode disposed between the first electrode and the second electrode and connected to a ground terminal; a first power supplier connected to the first electrode and the common electrode to supply first power of a frequency band for which measurement is required; a second power supplier connected to the second electrode and the common electrode to supply second power of a frequency band for which measurement is required; and a differential amplifier connected to the first electrode through a positive terminal and connected to the second electrode through a negative terminal to output a difference value between a first capacitance generated by the first electrode and a second capacitance generated by the second electrode in response to external application of a magnetic field.

Advantageous Effects

The magnetic sensor of the present invention may measure both DC and AC magnetic fields within a wide frequency band without requiring additional equipment or sensors, by using electric capacities (i.e., capacitances) generated, in response to application of a magnetic field, respectively by electrodes including a magnetic material and a non-magnetic material respectively. Furthermore, since both the non-magnetic electrode and the magnetic electrode are affected by the same external environment such as temperature and humidity, a change caused by an external environment is equally applied to the two electrodes. Therefore, a magnetic field may be measured without compensation for an influence of the external environment since the magnetic field is measured on the basis of a capacitance generated using a non-magnetic material.

BEST MODE FOR CARRYING OUT THE INVENTION

Figure 1:
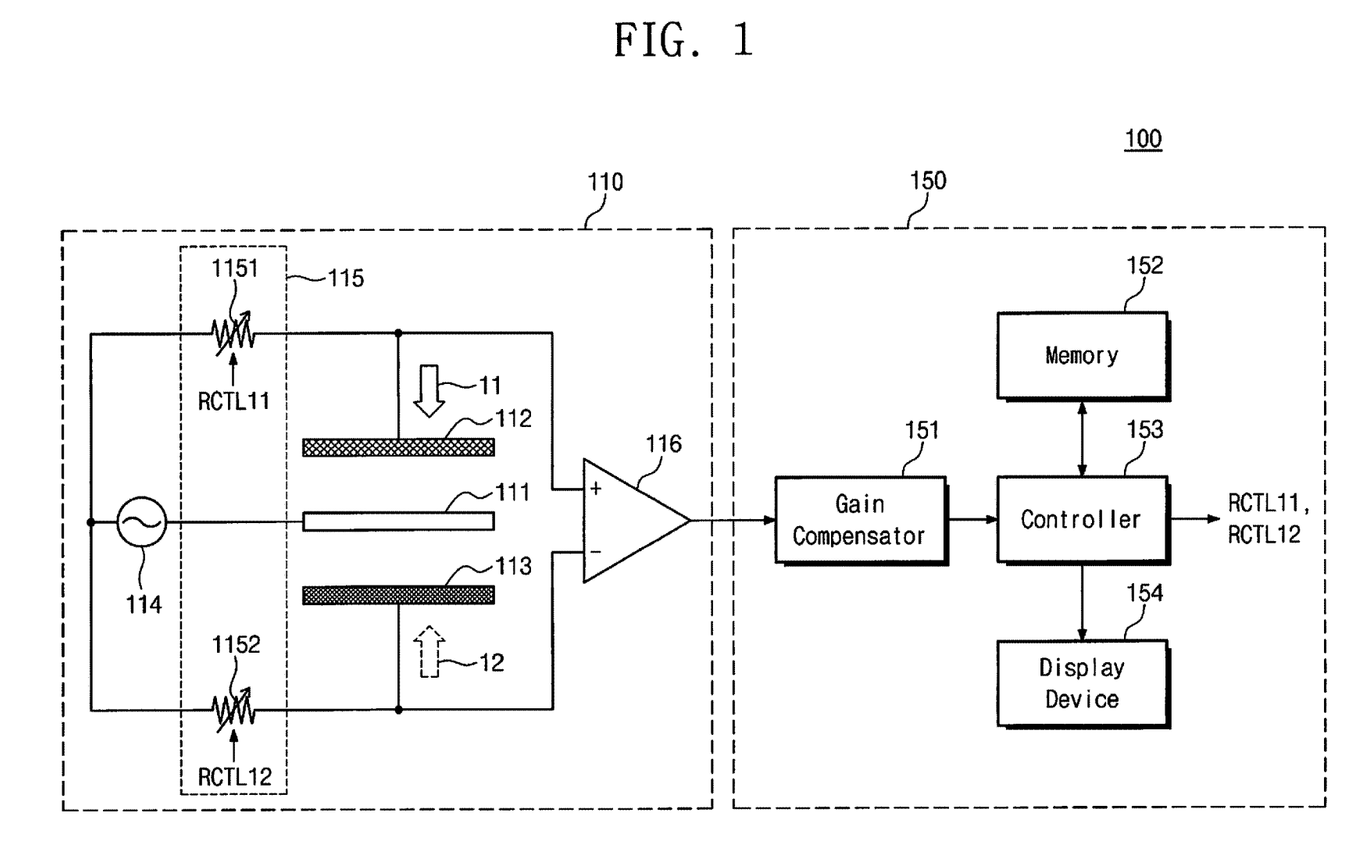
FIG. 1 is a diagram exemplarily illustrating a magnetic field measurement device according to the present invention.

FIG. 1 illustrates the best mode for carrying out the present invention.

Mode for Carrying Out the Invention

Preferred embodiments of the present invention will be described below in more detail with reference to the accompanying drawings. It should be noted that only descriptions required for assisting with an understanding of operation of the present invention are provided below and unnecessary detailed descriptions are not provided below so as not to obscure the gist of the present invention.

The present invention provides a magnetic field sensor which measures a magnetic field using a difference value between two electric capacities (e.g., capacitances) generated by using an electrode including a magnetic material and an electrode including a non-magnetic material, and a magnetic field measurement device including the magnetic field sensor.

FIG. 1 is a diagram exemplarily illustrating a magnetic field measurement device according to the present invention.

Referring to FIG. 1, a magnetic field measurement device 100 includes a magnetic field sensor 110 and a signal processor 150.

The magnetic field sensor 110 outputs an electric capacity (i.e., capacitance) generated due to application of a magnetic field. The magnetic field sensor 110 includes electrodes 111 to 113, a power supplier 114, a variable resistor 115, and a differential amplifier 116.

The electrodes 111 to 113 are arranged such that the first electrode 112 and the second electrode 113 are positioned at both sides of the common electrode 111 in order to generate a capacitance due to application of a magnetic field. At least a portion of the first electrode 112 includes a magnetic material. To this end, an entirety of the first electrode 112 may be formed of a magnetic material. Furthermore, in the case where the first electrode 112 is formed of a non-magnetic material, a magnetic material may be bonded, as a coating or the like, to one side surface or both side surfaces of the first electrode 112.

Unlike the first electrode 112, the second electrode 113 includes a non-magnetic material in at least a portion of the second electrode 113. To this end, the second electrode 113 may be formed of a non-magnetic material, or a non-magnetic material may be bonded, as a coating or the like, to one side surface or both side surfaces of the second electrode 113.

Although the first electrode 112 was described as including a magnetic material, and the second electrode 113 was described as including a non-magnetic material, the first electrode 112 and the second electrode 113 may be configured so that at least a portion of the first electrode 112 includes a non-magnetic material, and at least a portion of the second electrode 113 includes a magnetic material.

Meanwhile, when a magnetic field is applied, a capacitance is generated between the common electrode 111 and the first electrode 112, and a capacitance is generated between the common electrode 111 and the second electrode 113. Here, the magnetic field may be applied in a direction perpendicular to the flat electrodes 111 to 113, and may be applied from the outside of the magnetic field sensor 110 in a direction among a first direction 11 and a second direction 12.

One end of the power supplier 114 is connected to the first electrode 112 via a first variable resistor element 1151, and is connected to the second electrode 113 via a second variable resistor element 1152. The other end of the power supplier 114 is connected to the common electrode 111 to supply power. The power supplier 114 may supply power of a frequency band for which measurement is required, and, to this end, the power supplier 114 may include a frequency generator or may have a function of a frequency generator.

The variable resistor 115 controls at least one of a resistance value between the first electrode 112 and the power supplier 114 or a resistance value between the second electrode 113 and the power supplier 114. To this end, the variable resistor 115 may include at least one of the first variable resistor element 1151 or the second variable resistor element 1152.

One end of the first variable resistor element 1151 is connected to a contact point between the first electrode 112 and the differential amplifier 116, and the other end of the first variable resistor element 1151 is connected to a terminal (e.g., a positive (+) terminal) of the power supplier 114.

One end of the second variable resistor element 1152 is connected to a contact point between the second electrode 113 and the differential amplifier 116, and the other end of the second variable resistor element 1152 is connected to a terminal (e.g., a positive (+) terminal) of the power supplier 114.

Although FIG. 1 exemplarily illustrates that the variable resistor elements 1151 and 1152 are positioned between the first electrode 112 and the power supplier 114 (at a side of the first electrode 112) and between the second electrode 113 and the power supplier 114 (at a side of the second electrode 113), a variable resistor may be positioned at only one of the side of the first electrode 112 and the side of the second electrode 113.

Here, the variable resistor elements 1151 and 1152 may be controlled using resistor control signals RCTL11 and RCTL12 output from the controller 153, and may be set so that a difference value output from the differential amplifier 116 is zero (0) or minimized (i.e., close to 0) before measuring a magnetic field (e.g., at an initial state). The differential amplifier 116 includes a positive (+) terminal connected to the first electrode 112 and a negative (−) terminal connected to the second electrode 113. Accordingly, the differential amplifier 116 outputs a difference value between a capacitance generated by the common electrode 111 and the first electrode 112 and a capacitance generated by the common electrode 111 and the second electrode 113. In other words, the differential amplifier 115 differentially amplifies and outputs a difference between a capacitance (magnetic capacitance) generated through the first electrode 111 and a capacitance (magnetic capacitance) generated through the second electrode 113.

Meanwhile, in the case where the difference value output from the differential amplifier 116 is set to be zero (0) or minimized (i.e., close to 0) while a magnetic field is applied, the magnetic field may be measured on the basis of the resistor control signals RCTL11 and RCTL12 for controlling a resistance value of the variable resistor 115 or detected resistance values of the variable resistor 115 (or the variable resistor elements 1151 and 1152) (a detector for detecting resistance values may be added as necessary).

The signal processor 150 measures a magnetic field by processing a signal received through the magnetic field sensor 110. The signal processor 150 includes a gain compensator 151, a memory 152, a controller 153, and a display device 154.

The gain compensator 151 compensates gain by amplifying a signal output from the differential amplifier 116. The gain compensator 151 outputs a gain-compensated signal to the controller 153.

The memory 152 may store, under the control of the controller 153, an operation program for operating the signal processor 150 or data generated during operation of the signal processor 150, or may provide stored data to the controller 153. Furthermore, the memory 152 may store a magnetic field measurement table which contains magnetic field values corresponding to a signal, i.e., a capacitance, output from the magnetic field sensor 110.

The controller 153 may obtain a magnetic field intensity corresponding to a gain-compensated signal, i.e., a capacitance. To this end, the controller 153 may use data, i.e., the magnetic field measurement table, stored in the memory 152, and may be implemented so as to incorporate the memory 152. The controller 153 outputs, to the display device 154, a magnetic field intensity measured on the basis of a received signal. Furthermore, the controller 153 may output the resistor control signals RCTL11 and RCTL12 for controlling the variable resistor elements 1151 and 1152 so that the difference value output from the differential amplifier 116 is zero or minimized before a magnetic field is applied.

Meanwhile, in the case where the controller 153 measures a magnetic field by using resistance values of the variable resistor elements 1151 and 1152, the controller 153 may output the resistor control signals RCTL11 and RCTL12 for controlling the variable resistor elements 1151 and 1152 so that the difference value output from the differential amplifier 116 is zero or minimized after a magnetic field is applied. Thereafter, the controller 153 may measure a magnetic field on the basis of the resistor control signals RCTL11 and RCTL12 or detected resistance values of the variable resistor elements 1151 and 1152, when an output from the differential amplifier 116 is zero or minimized.

The display device 154 may output a received magnetic field intensity through a screen.

As described above, the magnetic field sensor 110 proposed in the present invention forms two electric capacitive sensors which are implemented by the electrodes 112 and 113 including a magnetic material and a non-magnetic material respectively and the common electrode 111 disposed between the electrodes 112 and 113. Therefore, the magnetic sensor 110 may measure not only DC magnetic fields but also AC magnetic fields of a high frequency band such as a megahertz (MHz) band, using combined two electric capacitive sensors which generate capacitances.

Furthermore, a magnetic field intensity is measured by simultaneously using a capacitance generated by the first electrode 112 including a magnetic material and the second electrode 113 including a non-magnetic electrode 112, among the two electric capacitive sensors. Like this, both DC and AC magnetic fields may be measured within a wide frequency band without adding other equipment or sensors, by using a capacitance at a measurement of magnetic fields.

Furthermore, since a magnetic electrode (e.g., the first electrode 112) and a non-magnetic electrode (e.g., the second electrode 113) are affected by the same external environment such as temperature and humidity, a change caused by an external environment is equally applied to the two electrodes. Therefore, magnetic fields may be measured without a compensation for an influence of an external environment by using capacitances generated by two electrodes. Therefore, a compensation for a measured magnetic field intensity, due to an environmental factor, is not required.

Figure 2:
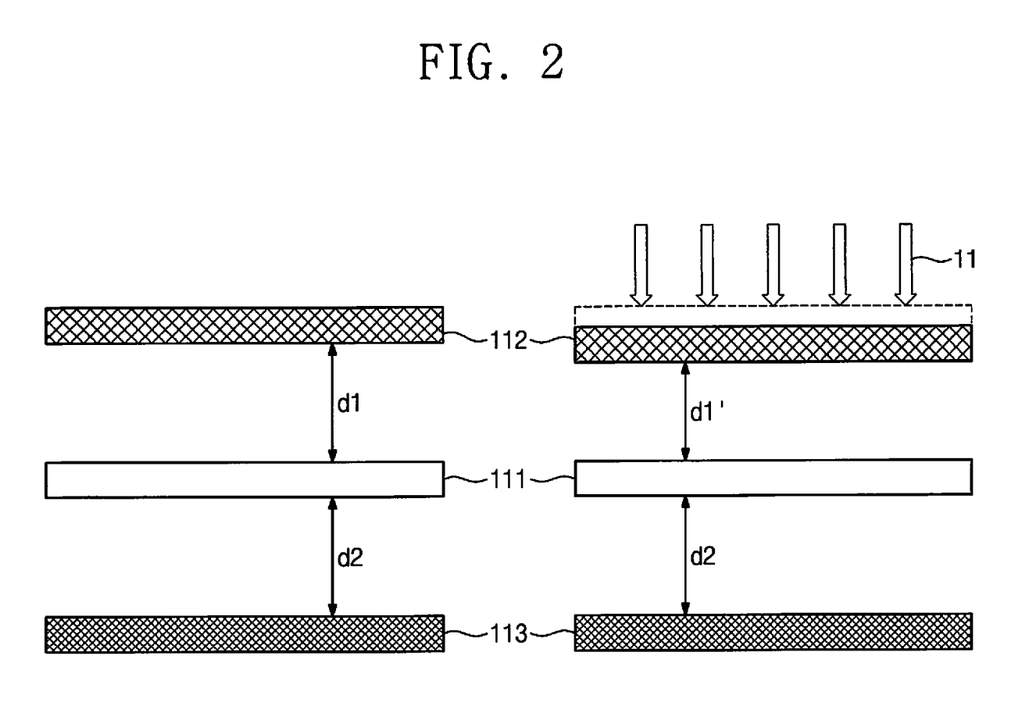
FIG. 2 is a diagram exemplarily illustrating a change of a distance between the electrodes of FIG. 1 due to application of a magnetic field.

FIG. 2 is a diagram exemplarily illustrating a change of a distance between electrodes due to application of a magnetic field according to the present invention.

A left side of FIG. 2 illustrates the electrodes 111 to 113 before application of a magnetic field, and a right side of FIG. 2 illustrates the electrodes 111 to 113 when a magnetic field is applied in the first direction 11.

When a magnetic field is applied in the first direction 11, a distance between the first electrode 112 including a magnetic material and the common electrode 111 changes from d1 to d1' in proportion to an intensity of the magnetic field. Here, a level of an electric capacity, i.e., a capacitance, also changes according to a change of the distance between the electrodes 111 and 112. In contrast, a distance between the second electrode 113 including a non-magnetic material and the common electrode 111 does not change from d2, and a value of an electric capacity, i.e., a capacitance, does not change either. Since a non-magnetic material is not affected by a magnetic field, the value of the capacitance generated by the second electrode 113 does not vary with a magnetic field. Therefore, a level of an electric capacity changed due to a magnetic field may be measured by simultaneously measuring a difference between the two capacitances.

Since most sensors for measuring magnetic fields are sensitive to a change of a peripheral environment such as temperature and humidity, an intensity of a magnetic field may be accurately measured by a compensation for such a change. However, according to the magnetic field sensor 110 proposed in the present invention, two electric capacitive sensors (a first electric capacitive sensor formed by the first electrode 112 and the common electrode 111 and a second electric capacitive sensor formed by the second electrode 113 and the common electrode 111) form a single sensor to measure a relative electric capacity (the second electric capacitive sensor is affected by the same environment as the first electric capacitive sensor), and thus a compensation for a change caused by an environmental factor (e.g., temperature, humidity, etc.) is not required. That is, an additional compensation procedure for an influence of an environmental factor is not required by using a difference of a distance change between the two electric capacitive sensors (an environmental factor is equally reflected to both the electric capacitive sensors).

Figure 3:
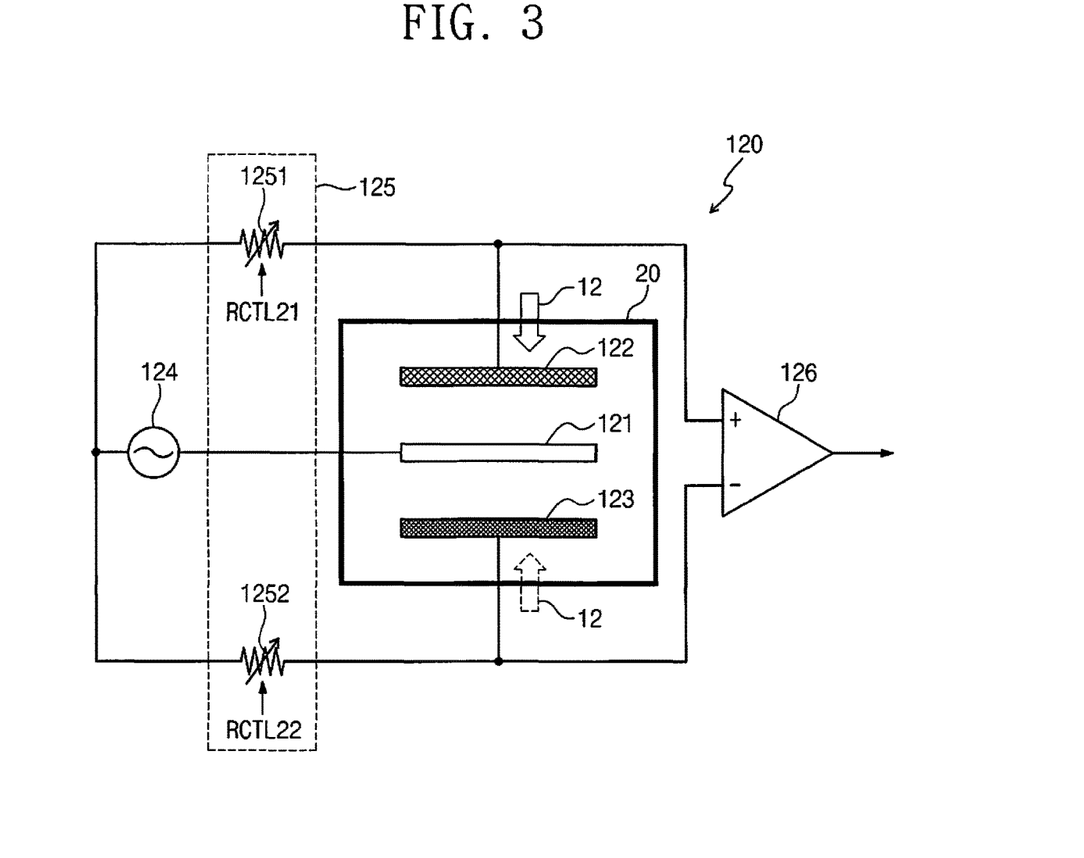
FIG. 3 is a diagram exemplarily illustrating a magnetic field sensor according to another embodiment of the present invention.

FIG. 3 is a diagram exemplarily illustrating a magnetic field sensor according to another embodiment of the present invention.

Referring to FIG. 3, a magnetic field sensor 120 includes electrodes 121 to 123, a power supplier 124, a variable resistor 125, and a differential amplifier 126. Here, the magnetic field sensor 120 may be connected to the signal processor 150 instead of the magnetic field sensor 110 of FIG. 1. Here, since descriptions of an overall structure of the magnetic field sensor 120 are similar to descriptions of the magnetic field sensor 110 of FIG. 1 except for the usage of a chamber 20, the descriptions of the magnetic sensor 110 of FIG. 1 are referred to.

The electrodes 121 to 123 of the magnetic field sensor 120 may be positioned within a chamber such as a Zero-Gauss chamber 20. Here, the Zero-Gauss chamber 20 is merely an example for easy description, and thus various types of chambers other than the Zero-Gauss chamber 20 may be used to measure a null balance of the electrodes 121 to 123 without being affected by external environmental factors.

Accordingly, the null balance of the electrodes 121 to 123 may be measured within the Zero-Gauss chamber 20. To this end, power of a frequency for which measurement is required is applied by controlling the signal processor 150 of FIG. 1, and the electrodes 121 to 123 are set to be in a null balance state while the electrodes 121 to 123 are positioned within the Zero-Gauss chamber 20 (i.e., output from the electrodes 121 to 123 positioned within the Zero-Gauss chamber 20 is set to be zero (or minimized)). Thereafter, an intensity of a magnetic field applied through the electrodes 121 to 123 may be measured while the Zero-Gauss chamber 20 is not present.

Furthermore, the magnetic field sensor 120 includes the variable resistor 125 when the Zero-Gauss chamber 20 is used. Here, the number of variable resistor elements 1251 and 1252 included in the variable resistor 125 may be at least one as described above with reference to FIG. 1. Therefore, the variable resistor 125 may include only one of the first variable resistor element 1251 and the second variable resistor element 1252 or both the first variable resistor element 1251 and the second variable resistor element 1252.

Thereafter, the output may be set, as necessary, to be zero or minimized by the controller 153 by using resistor control signals or the variable resistor elements 1251 and 1252 in a state where the Zero-Gauss chamber 20 of the variable resistor elements is not present, i.e., at the outside of the Zero-Gauss chamber 20.

A magnetic field measurement device using the magnetic field sensor 120 may measure a magnetic field intensity from resistance values of the variable resistor elements 1251 and 1252 or resistor control signals RCTL21 and RCTL22 (output from the controller 153) for setting the output to zero or minimized value by adjusting the resistance values of the variable resistor elements 1251 and 1252 in response to application of a magnetic field.

Figure 4:
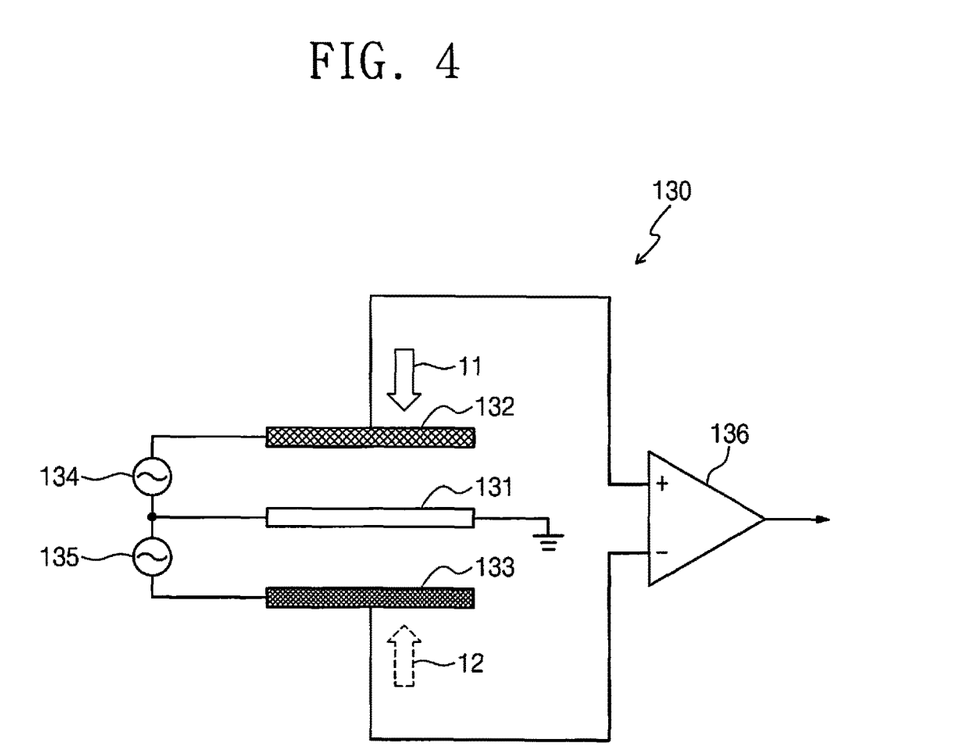
FIG. 4 is a diagram exemplarily illustrating a magnetic field sensor according to another embodiment of the present invention.

FIG. 4 is a diagram exemplarily illustrating a magnetic field sensor according to another embodiment of the present invention.

Referring to FIG. 4, a magnetic field sensor 130 includes electrodes 131 to 133, power suppliers 134 and 135, and a differential amplifier 136. Here, the magnetic field sensor 130 may also be connected to the signal processor 150 of FIG. 1.

Since overall descriptions of the electrodes 131 to 133 are similar to descriptions of the electrodes 111 to 113 of FIG. 1, the descriptions of the electrodes 111 to 113 of FIG. 1 are referred to.

The first electrode 132 is connected to a positive (+) terminal of the differential amplifier 136, and the second electrode 133 is connected to a negative (−) terminal of the differential amplifier 136. Furthermore, the common electrode 131 is connected to a ground terminal, i.e., grounded.

The power suppliers 134 and 135 supply power to the electrodes 131 to 133, and may supply power of a frequency band for which measurement is required. To this end, the power suppliers 134 and 135 may include a frequency generator or may have a function of a frequency generator.

One end of the first power supplier 134 is connected to the first electrode 132, and the other end of the first power supplier 134 is connected to the common electrode 131.

One end of the second power supplier 135 is connected to the second electrode 133, and the other end of the second power supplier 135 is connected to the common electrode 131. Accordingly, a contact point between the first power supplier 134 and the second power supplier 135 is connected to the common electrode 131.

The power suppliers 134 and 135 may represent power branching off from a single power source, or may represent power individually supplied.

The differential amplifier 136 includes a positive (+) terminal connected to the first electrode 132 and a negative (−) terminal connected to the second electrode 133. Accordingly, the differential amplifier 136 outputs a difference value between a capacitance generated by the common electrode 131 and the first electrode 132 and a capacitance generated by the common electrode 131 and the second electrode 133. In other words, the differential amplifier 136 differentially amplifies and outputs a difference between a capacitance (magnetic capacitance) generated through the first electrode 132 and a capacitance (magnetic capacitance) generated through the second electrode 133.

Although not illustrated in detail in FIG. 4, the magnetic field sensor 130 may include a variable resistor (or variable resistor elements) and may further include, as necessary, additional resistor (or resistor elements). Here, the magnetic field sensor 130 may perform an operation such as initial state setting (an output of the differential amplifier 136 is set to be zero or minimized (i.e., close to 0)) prior to measurement of a magnetic field by controlling variable resistor elements.

Figure 5:
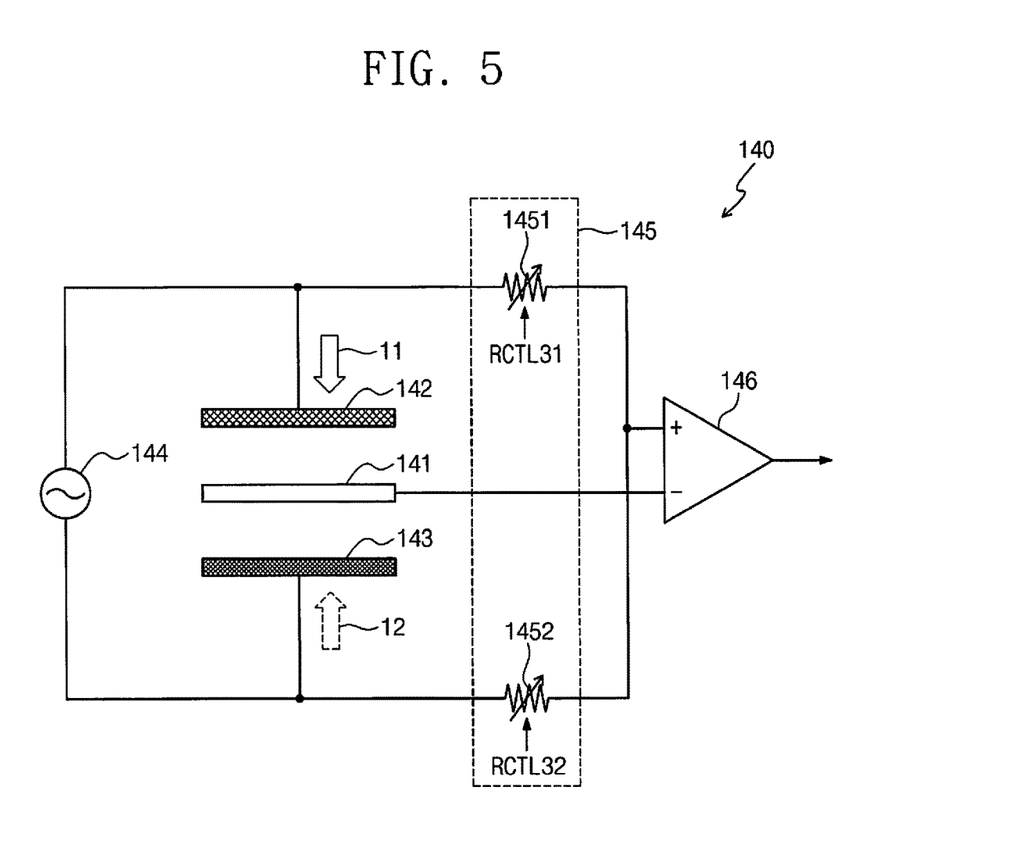
FIG. 5 is a diagram exemplarily illustrating a magnetic field sensor according to another embodiment of the present invention.

FIG. 5 is a diagram exemplarily illustrating a magnetic field sensor according to another embodiment of the present invention.

Referring to FIG. 5, a magnetic field sensor 140 includes electrodes 141 to 143, a power supplier 144, a variable resistor 145, and a differential amplifier 146. Here, the magnetic field sensor 140 may also be connected to the signal processor 150 of FIG. 1.

Since overall descriptions of the electrodes 141 to 143 are similar to descriptions of the electrodes 111 to 113 of FIG. 1, the descriptions of the electrodes 111 to 113 of FIG. 1 are referred to.

One end of the power supplier 144 is connected to the first electrode 142 and the other end of the power supplier 144 is connected to the other end of the second electrode 143 to supply power. The common electrode 141 is connected to a negative terminal (−) of the differential amplifier 146.

The power supplier 144 may supply power of a frequency band for which measurement is required, and, to this end, the power supplier 144 may include a frequency generator or may have a function of a frequency generator.

The variable resistor 145 controls at least one of a resistance value between the first electrode 142 and the differential amplifier 146 or a resistance value between the second electrode 143 and the differential amplifier 146. To this end, the variable resistor 145 may include at least one of a first variable resistor element 1451 or a second variable resistor element 1452.

One end of the first variable resistor element 1451 is connected to the first electrode 142, and the other end of the first variable resistor element 1451 is connected to a positive (+) terminal of the differential amplifier 146.

One end of the second variable resistor element 1452 is connected to the second electrode 143, and the other end of the second variable resistor element 1452 is connected to a contact point between the positive (+) terminal of the differential amplifier 146 and the first variable resistor element 1451.

Although FIG. 4 exemplarily illustrates that the variable resistor elements 1451 and 1452 are positioned between the first electrode 142 and the differential amplifier 146 (at a side of the first electrode 142) and between the second electrode 143 and the differential amplifier 146 (at a side of the second electrode 143), a variable resistor may be positioned at only one of the side of the first electrode 142 and the side of the second electrode 143.

Here, the variable resistor elements 1451 and 1452 may be controlled using resistor control signals RCTL31 and RCTL32 output from the controller 153 of FIG. 1, and may be set so that a difference value output from the differential amplifier 146 is zero (0) or minimized (i.e., close to 0) before measuring a magnetic field.

The differential amplifier 146 includes the positive (+) terminal connected to the first electrode 142 and the second electrode 143 and a negative (−) terminal connected to the common electrode 141. Accordingly, the differential amplifier 146 outputs a difference value between a capacitance generated by the common electrode 141 and the first electrode 142 and a capacitance generated by the common electrode 141 and the second electrode 143. In other words, the differential amplifier 146 differentially amplifies and outputs a difference between a capacitance (magnetic capacitance) generated through the first electrode 142 and a capacitance (magnetic capacitance) generated through the second electrode 143.

Meanwhile, in the case where the difference value output from the differential amplifier 146 is set to be zero (0) or minimized (i.e., close to 0) while a magnetic field is applied, the magnetic field may be measured on the basis of the resistor control signals RCTL31 and RCTL32 for controlling a resistance value of the variable resistor 145 or detected resistance values of the variable resistor 145 (or the variable resistor elements 1451 and 1452) (a detector for detecting resistance values may be added as necessary).

Although FIGS. 1, 3, 5, and 6 illustrate variable resistors (or variable resistor elements), variable capacitors (or variable capacitor elements) may be used instead of the variable resistors.

Figure 6:
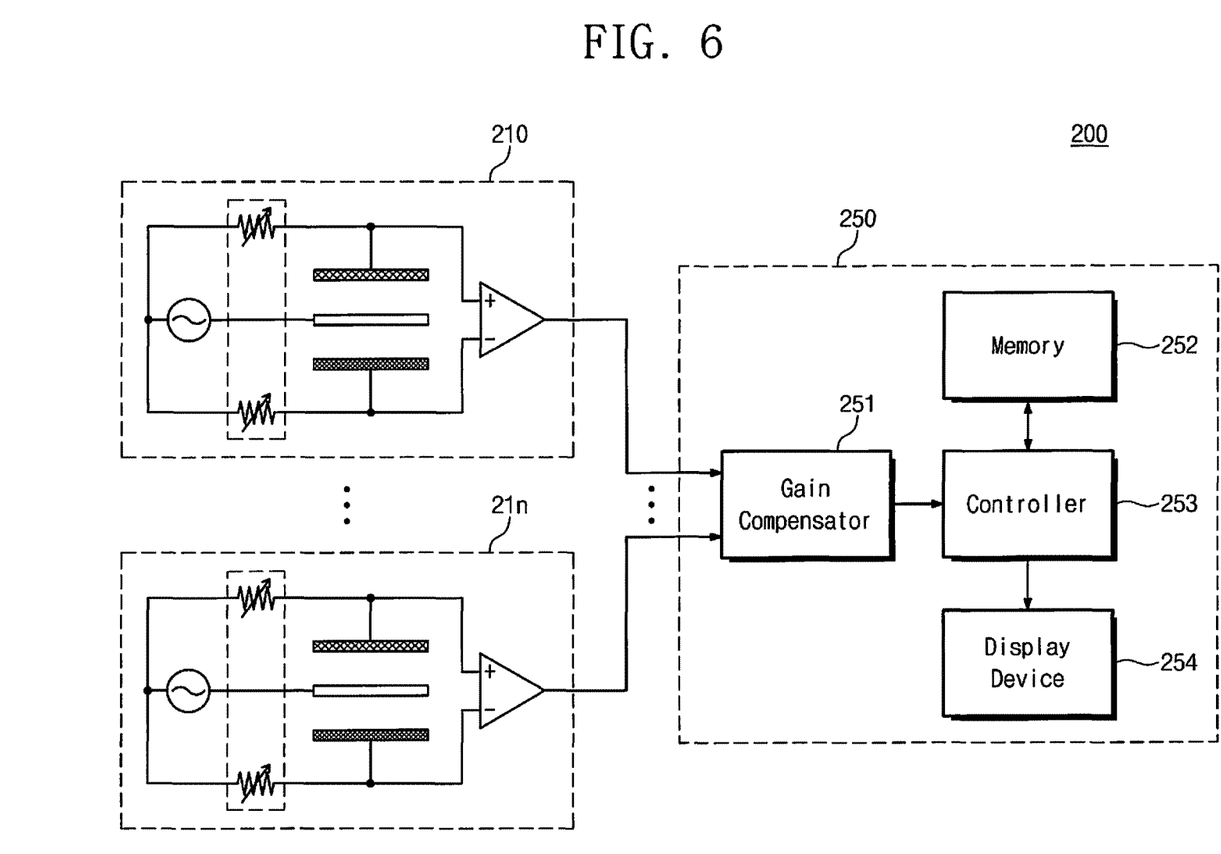
FIG. 6 is a diagram exemplarily illustrating a magnetic field measurement device according to another embodiment of the present invention.

FIG. 6 is a diagram exemplarily illustrating a magnetic field measurement device according to another embodiment of the present invention.

Referring to FIG. 6, a magnetic field measurement device 200 may include first to nth magnetic field sensors 210 to 21$n$ and a signal processor 250. In the magnetic field measurement device 200, a plurality of magnetic field sensors 210 to 21n are arrayed for one signal processor 250.

Although the magnetic field sensors 210 to 21n are exemplarily illustrated as having a stricture similar to that of the magnetic field sensor 110 of FIG. 1, the magnetic field sensors 210 to 21n may have the structures illustrated in FIGS. 3 to 5.

The signal processor 250 measures a magnetic field by processing signals received through the magnetic field sensors 210 to 21n. The signal processor 250 includes a gain compensator 251, a memory 252, a controller 253, and a display device 254.

Since overall descriptions of the signal processor 250 are similar to descriptions of the signal processor 150 of FIG. 1, the descriptions of the signal processor 150 of FIG. 1 are referred to.

Here, the gain compensator 251 receives signals of the magnetic field sensors 210 to 21n. Therefore, the controller 253 may obtain a magnetic field intensity for each of the magnetic field sensors 210 to 21n, and may output obtained magnetic field intensities to the display device 254.

Accordingly, when the magnetic field measurement device 200 is used, a magnetic field change within a specific zone or area may be measured by arranging the magnetic field sensors 210 to 21n at various locations.

Meanwhile, the magnetic field measurement devices proposed in the present invention may measure a magnetic field from at least one of a resistance value (or resistor control signal) or a capacitance (i.e., a difference between two capacitances) output from a differential amplifier on the basis of a magnetic field change depending on a null balance.

The magnetic field measurement devices proposed in the present invention may measure both DC and AC magnetic fields using one sensor in which electrodes including a magnetic material and a non-magnetic material respectively are arranged on the basis of a common electrode. Furthermore, the magnetic field measurement devices may cover a wide frequency range of up to megahertz band when measuring AC magnetic fields. Accordingly, the magnetic field measurement devices may be used to measure not only DC magnetic fields but also AC magnetic fields. Furthermore, the magnetic field measurement devices have structures that do not require a compensation for an environmental influence such as temperature or humidity, and thus magnetic fields may be measured with a minimized environmental influence.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

INDUSTRIAL APPLICABILITY

The present invention, which relates to a magnetic field measurement system, may provide a magnetic field sensor and a magnetic field measurement device capable of measuring a DC magnetic field and an AC magnetic field of a wide frequency domain.

The invention claimed is:

1. A magnetic field sensor comprising:
   a first electrode comprising a magnetic material at least partially;
   a second electrode comprising a non-magnetic material at least partially;
   a common electrode disposed between the first electrode and the second electrode and connected to a ground terminal;
   a power supplier of which one end is connected to the first electrode and the second electrode and of which another end is connected to the common electrode to supply power of a frequency band required;
   a variable resistor configured to control at least one of a resistance value between the first electrode and the power supplier or a resistance value between the second electrode and the power supplier; and
   a differential amplifier connected to the first electrode through a positive terminal and connected to the second electrode through a negative terminal to output a difference value between a first capacitance generated by the first electrode and a second capacitance generated by the second electrode in response to external application of a magnetic field,
   wherein a distance between the first and common electrodes changes by the external application of a magnetic field and a distance between the second and common electrodes does not change by the external application of a magnetic field.

2. The magnetic field sensor of claim 1, wherein the first electrode and the common electrode form a single electric capacitive sensor, and the second electrode and the common electrode form another single electric capacitive sensor.

3. The magnetic field sensor of claim 1, wherein the variable resistor comprises at least one of:
   a first variable resistor element disposed between the first electrode and the power supplier to control a resistance value; or
   a second variable resistor element disposed between the second electrode and the power supplier to control a resistance value.

4. The magnetic field sensor of claim 3, wherein the first variable resistor element and the second variable resistor element output a resistance change value which adjusts the difference value to zero or a minimized value in response to a resistor control signal.

5. The magnetic field sensor of claim 1,
   wherein the first electrode, the second electrode, and the common electrode are arranged within a Zero-Gauss chamber to measure a null balance for magnetic field measurement, and the difference value is output in response to an applied magnetic field on a basis of a magnetic field change depending on the null balance,
   wherein the null balance is a state in which the difference value obtained from the first electrode, the second electrode, and the common electrode is set to be zero or a minimized value.

6. The magnetic field sensor of claim 1, wherein the magnetic field is applied in a perpendicular direction to surfaces of the first electrode and the second electrode.

7. A magnetic field measurement device comprising:
   at least one magnetic field sensor configured to measure a capacitance depending on a change of a magnetic field; and
   a signal processor configured to receive the capacitance and measure the magnetic field, wherein each of the at least one magnetic field sensor comprises:
a first electrode comprising a magnetic material at least partially;
a second electrode comprising a non-magnetic material at least partially;
a common electrode disposed between the first electrode and the second electrode and connected to a ground terminal;
a power supplier of which one end is connected to the first electrode and the second electrode and of which another end is connected to the common electrode to supply power of a frequency band required;
a variable resistor configured to control at least one of a resistance value between the first electrode and the power supplier or a resistance value between the second electrode and the power supplier; and
a differential amplifier connected to the first electrode through a positive terminal and connected to the second electrode through a negative terminal to output a difference value between a first capacitance generated by the first electrode and a second capacitance generated by the second electrode in response to external application of a magnetic field,
wherein a distance between the first and common electrodes changes by the external application of a magnetic field and a distance between the second and common electrodes does not change by the external application of a magnetic field.

8. The magnetic field measurement device of claim 7, wherein the signal processor comprises:
a gain compensator configured to receive the difference value and compensate a gain of the difference value received;
a memory configured to store a magnetic field measurement table containing a magnetic field intensity corresponding to the difference value;
a controller configured to obtain, on a basis of the magnetic field measurement table, the magnetic field intensity corresponding to the gain-compensated difference value and output the magnetic field intensity obtained; and
a display unit configured to display the magnetic field intensity output.

9. The magnetic field measurement device of claim 8, wherein, upon outputting a resistor control signal for controlling a resistance value of the variable resistor so that the difference value becomes zero or minimized, the controller measures the magnetic field on a basis of one of the resistor control signal and the resistance value controlled in response to the resistor control signal.

10. The magnetic field measurement device of claim 7, wherein the first electrode and the common electrode form a single electric capacitive sensor, and the second electrode and the common electrode form another single electric capacitive sensor.

11. The magnetic field measurement device of claim 7, wherein the variable resistor comprises at least one of:
a first variable resistor element disposed between the first electrode and the power supplier to control a resistance value; or
a second variable resistor element disposed between the second electrode and the power supplier to control a resistance value.

12. The magnetic field measurement device of claim 11, wherein the first variable resistor element and the second variable resistor element output a resistance change value which adjusts the difference value to zero or a minimized value in order to measure the magnetic field in response to a resistor control signal.

13. The magnetic field measurement device of claim 7, wherein the first electrode, the second electrode, and the common electrode are arranged within a Zero-Gauss chamber to measure a null balance for magnetic field measurement, and the difference value is output in response to an applied magnetic field on a basis of a magnetic field change depending on the null balance,
wherein the null balance is a state in which the difference value obtained from the first electrode, the second electrode, and the common electrode is set to be zero or a minimized value.

14. The magnetic field measurement device of claim 7, wherein the magnetic field is applied in a perpendicular direction to surfaces of the first electrode and the second electrode.

15. A magnetic field sensor comprising:
a first electrode comprising a magnetic material at least partially;
a second electrode comprising a non-magnetic material at least partially;
a common electrode disposed between the first electrode and the second electrode and connected to a ground terminal;
a first power supplier connected to the first electrode and the common electrode to supply first power of a frequency band for which measurement is required; a second power supplier connected to the second electrode and the common electrode to supply second power of a frequency band for which measurement is required; and
a differential amplifier connected to the first electrode through a positive terminal and connected to the second electrode through a negative terminal to output a difference value between a first capacitance generated by the first electrode and a second capacitance generated by the second electrode in response to external application of a magnetic field,
wherein a distance between the first and common electrodes changes by the external application of a magnetic field and a distance between the second and common electrodes does not change by the external application of a magnetic field.

* * * * *